United States Patent
Xie et al.

(10) Patent No.: US 8,364,112 B2
(45) Date of Patent: Jan. 29, 2013

(54) LINEARIZATION TECHNIQUE FOR MIXER

(75) Inventors: Haolu Xie, Chandler, AZ (US); Manish N. Shah, Chandler, AZ (US); Patrick L. Rakers, Scottsdale, AZ (US)

(73) Assignee: Fujitsu Semiconductor Limited, Yokohama-Shi (JP)

( * ) Notice: Subject to any disclaimer, the term of this patent is extended or adjusted under 35 U.S.C. 154(b) by 115 days.

(21) Appl. No.: 13/078,502

(22) Filed: Apr. 1, 2011

(65) Prior Publication Data

US 2012/0252396 A1 Oct. 4, 2012

(51) Int. Cl.
*H04B 1/16* (2006.01)

(52) U.S. Cl. .................................... 455/323
(58) Field of Classification Search ............ 455/313, 455/318, 323, 334
See application file for complete search history.

(56) References Cited

U.S. PATENT DOCUMENTS

| | | | |
|---|---|---|---|
| 5,886,547 A | 3/1999 | Durec et al. | 327/113 |
| 6,847,808 B2 | 1/2005 | Zhou | 455/189.1 |
| 7,113,755 B2 | 9/2006 | Abdelli | 455/118 |
| 7,505,750 B2 * | 3/2009 | Lee et al. | 455/323 |
| 7,657,247 B1 * | 2/2010 | Tsai et al. | 455/333 |

* cited by examiner

*Primary Examiner* — Blane J Jackson
(74) *Attorney, Agent, or Firm* — Baker Botts L.L.P.

(57) ABSTRACT

A technique for improving the linearity of a mixer is disclosed. A converter may include a mixer comprising a first metal-oxide semiconductor field-effect transistor (MOSFET) having a gate, a first conducting terminal coupled to an input of the converter, and a second conducting terminal coupled to an output of the converter, and a mixer driver having a first output coupled to the gate of the first MOSFET, the mixer driver configured to receive a local-oscillator signal having a first phase and a second phase, drive the first MOSFET off during the first phase of the local-oscillator signal, drive the first MOSFET on for a first period of time in response to a transition from the first phase of the local-oscillator signal to the second phase of the local-oscillator signal, and force the gate of the first MOSFET into a high impedance state for a second period of time during the second phase of the local-oscillator signal and after the expiration of the first period of time.

20 Claims, 4 Drawing Sheets

LINEARIZATION TECHNIQUE FOR MIXER

TECHNICAL FIELD

The present disclosure relates generally to wireless communication and, more particularly, to the linearity of upconverters and downconverters in wireless communication devices.

BACKGROUND

Wireless communications systems are used in a variety of telecommunications systems, television, radio and other media systems, data communication networks, and other systems to convey information between remote points using wireless transmitters and wireless receivers. A transmitter is an electronic device which, usually with the aid of an antenna, propagates an electromagnetic signal such as radio, television, or other telecommunications. Transmitters often include signal amplifiers which receive a radio-frequency or other signal, amplify the signal by a predetermined gain, and communicate the amplified signal. On the other hand, a receiver is an electronic device which, also usually with the aid of an antenna, receives and processes a wireless electromagnetic signal. In certain instances, a transmitter and receiver may be combined into a single device called a transceiver.

Receivers include a number of components that are arranged to convert a received wireless signal, usually in the radio-frequency spectrum, to a digital signal capable of being processed by digital circuitry (e.g., microprocessors, digital signal processors, etc.). Selected components of a traditional receiver are shown in FIG. 6. As shown in FIG. 6, a traditional receiver 600 may include a bandpass filter 605 and a low-noise amplifier (LNA) 610 to amplify a received radio-frequency (RF) signal. The amplified RF signal may then be frequency downconverted by a downconverter 620 based on a local-oscillator signal produced by oscillator 630. The downconverted signal may then be filtered by low-pass filter 640, providing a low-pass filtered analog signal at its output. This analog signal may be converted to a digital signal by analog-to-digital converter (ADC) 650. Such digital signal may then be communicated to digital circuitry for further processing.

In such traditional receiver designs, the downconverter 620 may be implemented by a mixer having a metal-oxide semiconductor field-effect transistor (MOSFET), wherein the RF signal passes through the conducting terminals of the MOSFET while the gate of the MOSFET is driven with the local-oscillator signal. During the phase of the local-oscillator signal that turns the MOSFET on, the RF signal will pass through the MOSFET. During the on phase of the oscillation signal, the voltage at the gate of the MOSFET is traditionally held steady by the local-oscillator signal, and the voltage at the conducting terminals of the MOSFET will vary with the RF signal. Therefore, during the on phase of the local-oscillator signal, the gate-to-source voltage of the MOSFET will vary as the voltage potential of RF signal varies. Accordingly, during the on phase of the local-oscillator signal, the resistance ($R_{on}$) of the MOSFET will vary with the RF signal as the RF signal passes through the MOSFET. The varying $R_{on}$ will add a nonlinear component to the signal being passed through the MOSFET during the downconversion.

Transmitters include a number of components that are arranged to convert a digital signal to a wireless signal in the radio frequency spectrum. A traditional transmitter may include a digital-to-analog converter (DAC) to convert the digital signal into an analog signal, and an upconverter to frequency upconvert the analog signal into a frequency spectrum that can be wirelessly transmitted. Similar to the downconverter discussed above, the upconverter may be implemented with a MOSFET, wherein the analog signal passes through the conducting terminals of the MOSFET while the gate of the MOSFET is driven with the oscillation signal. Accordingly, a traditional transmitter may experience the similar nonlinear effects due to a varying $R_{on}$ as a signal is passed through the conducting terminals of a MOSFET during upconversion.

SUMMARY

In accordance with some embodiments of the present disclosure, a converter may include a mixer comprising a first metal-oxide semiconductor field-effect transistor (MOSFET) having a gate, a first conducting terminal coupled to an input of the converter, and a second conducting terminal coupled to an output of the converter, and a mixer driver having a first output coupled to the gate of the first MOSFET, the mixer driver configured to receive a local-oscillator signal having a first phase and a second phase, drive the first MOSFET off during the first phase of the local-oscillator signal, drive the first MOSFET on for a first period of time in response to a transition from the first phase of the local-oscillator signal to the second phase of the local-oscillator signal, and force the gate of the first MOSFET into a high impedance state for a second period of time during the second phase of the local-oscillator signal and after the expiration of the first period of time.

Technical advantages of one or more embodiments of the present disclosure may include reducing non-linear effects in a mixer during the upconversion or downconversion of a signal.

It will be understood that the various embodiments of the present disclosure may include some, all, or none of the enumerated technical advantages. In addition, other technical advantages of the present disclosure may be readily apparent to one skilled in the art from the figures, description and claims included herein.

BRIEF DESCRIPTION OF THE DRAWINGS

For a more complete understanding of the present disclosure and its features and advantages, reference is now made to the following description, taken in conjunction with the accompanying drawings, in which.

DETAILED DESCRIPTION

Figure 1:
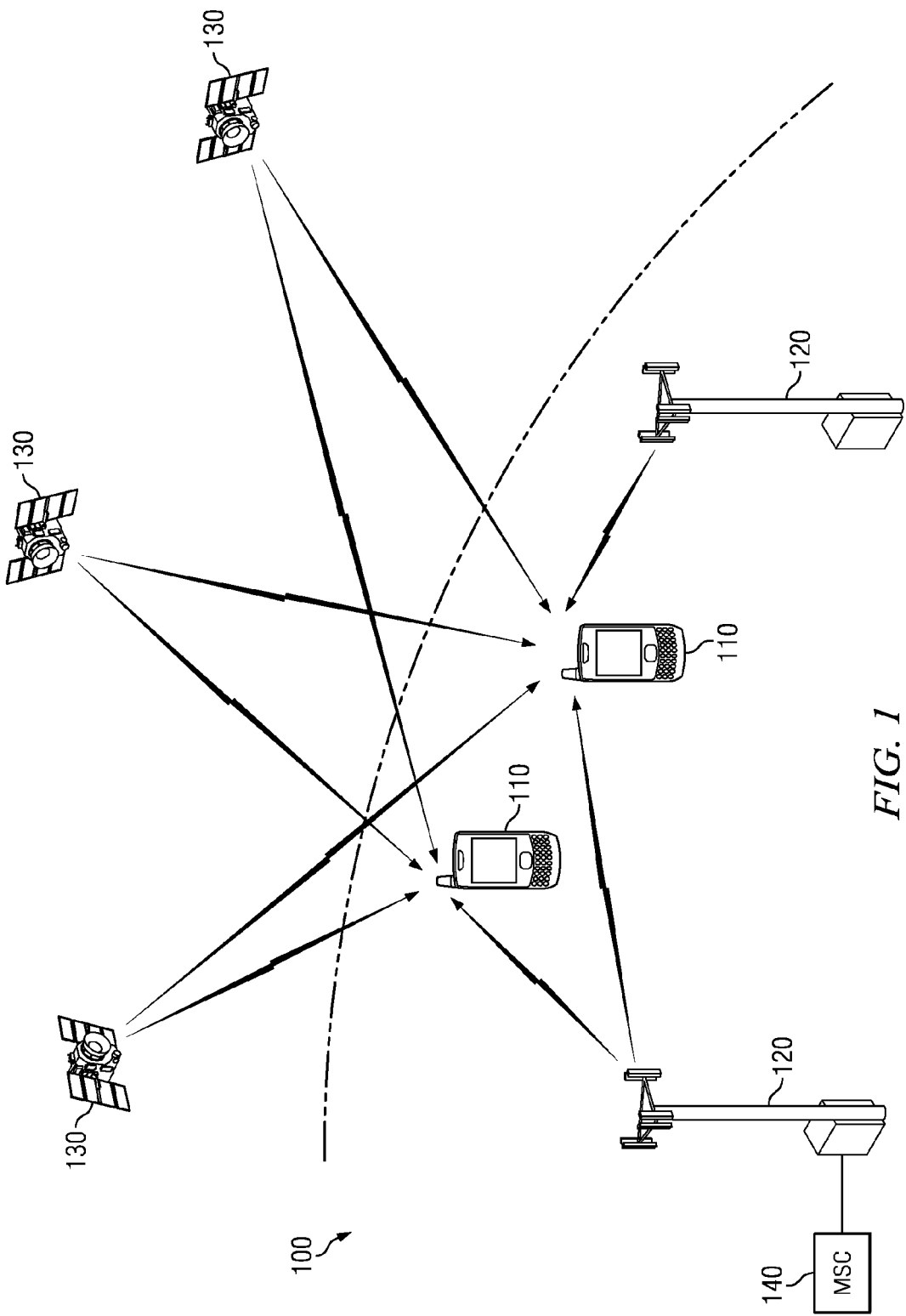
FIG. 1 illustrates a block diagram of an example wireless communication system, in accordance with certain embodiments of the present disclosure.

FIG. 1 illustrates a block diagram of an example wireless communication system 100, in accordance with certain embodiments of the present disclosure. For simplicity, only two terminals 110 and two base stations 120 are shown in FIG. 1. A terminal 110 may also be referred to as a remote station, a mobile station, an access terminal, user equipment (UE), a wireless communication device, a cellular phone, or some other terminology. A base station 120 may be a fixed station and may also be referred to as an access point, a Node B, or some other terminology. A mobile switching center (MSC) 140 may be coupled to the base stations 120 and may provide coordination and control for base stations 120.

A terminal 110 may or may not be capable of receiving signals from satellites 130. Satellites 130 may belong to a satellite positioning system such as the well-known Global Positioning System (GPS). Each GPS satellite may transmit a GPS signal encoded with information that allows GPS receivers on earth to measure the time of arrival of the GPS signal. Measurements for a sufficient number of GPS satellites may be used to accurately estimate a three-dimensional position of a GPS receiver. A terminal 110 may also be capable of receiving signals from other types of transmitting sources such as a Bluetooth transmitter, a Wireless Fidelity (Wi-Fi) transmitter, a wireless local area network (WLAN) transmitter, an IEEE 802.11 transmitter, and any other suitable transmitter.

In FIG. 1, each terminal 110 is shown as receiving signals from multiple transmitting sources simultaneously, where a transmitting source may be a base station 120 or a satellite 130. In certain embodiments, a terminal 110 may also be a transmitting source. In general, a terminal 110 may receive signals from zero, one, or multiple transmitting sources at any given moment.

System 100 may be a Code Division Multiple Access (CDMA) system, a Time Division Multiple Access (TDMA) system, or some other wireless communication system. A CDMA system may implement one or more CDMA standards such as IS-95, IS-2000 (also commonly known as "1x"), IS-856 (also commonly known as "1xEV-DO"), Wideband-CDMA (W-CDMA), and so on. A TDMA system may implement one or more TDMA standards such as Global System for Mobile Communications (GSM). The W-CDMA standard is defined by a consortium known as 3GPP, and the IS-2000 and IS-856 standards are defined by a consortium known as 3GPP2.

Figure 2:
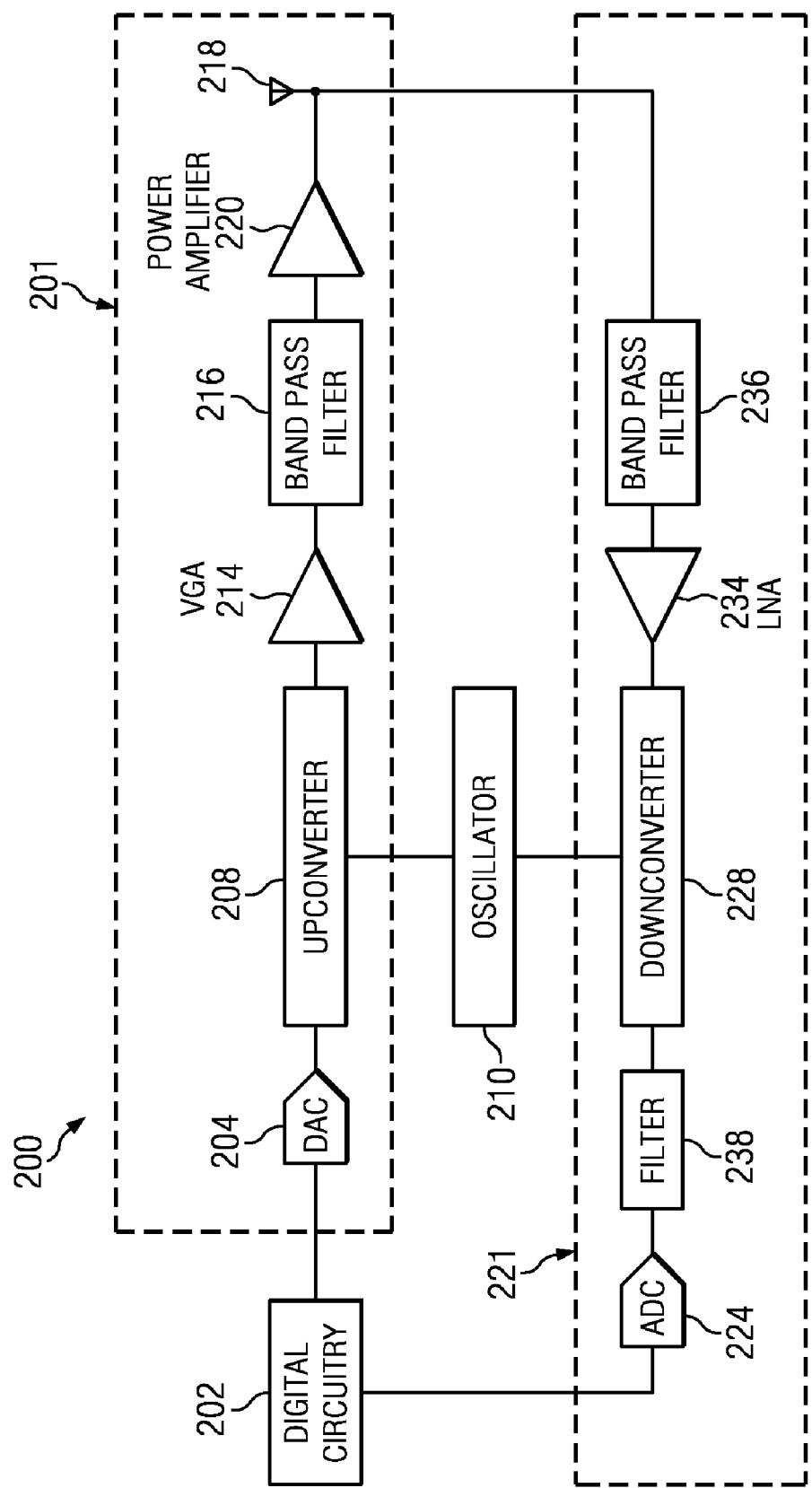
FIG. 2 illustrates a block diagram of selected components of an example transmitting and/or receiving element, in accordance with certain embodiments of the present disclosure.

FIG. 2 illustrates a block diagram of selected components of an example transmitting and/or receiving element 200 (e.g., a terminal 110, a base station 120, or a satellite 130), in accordance with certain embodiments of the present disclosure. Element 200 may include a transmit path 201 and/or a receive path 221. Depending on the functionality of element 200, element 200 may be considered a transmitter, a receiver, or a transceiver.

As depicted in FIG. 2, element 200 may include digital circuitry 202. Digital circuitry 202 may include any system, device, or apparatus configured to process digital signals and information received via receive path 221, and/or configured to process signals and information for transmission via transmit path 201. Such digital circuitry 202 may include one or more microprocessors, digital signal processors, and/or other suitable devices.

Transmit path 201 may include a digital-to-analog converter (DAC) 204. DAC 204 may be configured to receive a digital signal from digital circuitry 202 and convert such digital signal into an analog signal. Such analog signal may then be passed to one or more other components of transmit path 201, including upconverter 208.

Upconverter 208 may be configured to frequency upconvert an analog signal received from DAC 204 to a wireless communication signal at a radio frequency based on an oscillator signal provided by oscillator 210. Oscillator 210 may be any suitable device, system, or apparatus configured to produce an waveform of a particular frequency for modulation or upconversion of an analog signal to a wireless communication signal, or for demodulation or downconversion of a wireless communication signal to an analog signal. In some embodiments, oscillator 210 may be a digitally-controlled crystal oscillator.

Transmit path 201 may include a variable-gain amplifier (VGA) 214 to amplify an upconverted signal for transmission, and a bandpass filter 216 configured to receive an amplified signal VGA 214 and pass signal components in the band of interest and remove out-of-band noise and undesired signals. The bandpass filtered signal may be received by power amplifier 220 where it is amplified for transmission via antenna 218. Antenna 218 may receive the amplified and transmit such signal (e.g., to one or more of a terminal 110, a base station 120, and/or a satellite 130).

Receive path 221 may include a bandpass filter 236 configured to receive a wireless communication signal (e.g., from a terminal 110, a base station 120, and/or a satellite 130) via antenna 218. Bandpass filter 236 may pass signal components in the band of interest and remove out-of-band noise and undesired signals. In addition, receive path 221 may include a low-noise amplifier (LNA) 224 to amplify a signal received from bandpass filter 236.

Receive path 221 may also include a downconverter 228. Downconverter 228 may be configured to frequency downconvert a wireless communication signal received via antenna 218 and amplified by LNA 234 by an oscillator signal provided by oscillator 210 (e.g., downconvert to a baseband signal). Receive path 221 may further include a low pass filter 238, which may be configured to filter a downconverted wireless communication signal in order to pass the signal components within a radio-frequency channel of interest and/or to remove noise and undesired signals that may be generated by the downconversion process. In addition, receive path 221 may include an analog-to-digital converter (ADC) 224 configured to receive an analog signal from low pass filter 238 and convert such analog signal into a digital signal. Such digital signal may then be passed to digital circuitry 202 for processing.

Figure 3:
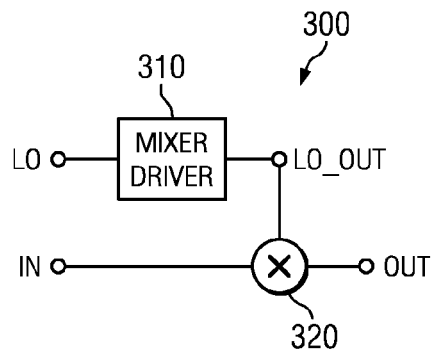
FIG. 3 illustrates a block diagram of an example converter, in accordance with certain embodiments of the present disclosure.

FIG. 3 illustrates a block diagram of an example converter 300 (e.g., a downconverter 228 and/or an upconverter 208), in accordance with certain embodiments of the present disclosure. As shown in FIG. 3, converter 300 may include a mixer driver 310 and a mixer 320. Mixer 320 may be a bi-directional device capable of either downconverting or upconverting a signal. Accordingly, for the purposes of this invention, the term converter refers to a device configured to operate as either an upconverter or a downconverter or both.

Converter 300 may receive a local-oscillator signal (LO) and an input signal (IN). Inside converter 300, mixer driver 310 may receive the LO signal and output a modified local-oscillator signal (LO_OUT). Mixer 320 may receive the input signal and the modified local-oscillator signal LO_OUT. Mixer may mix these two signals and produce an output signal OUT.

Figure 4:
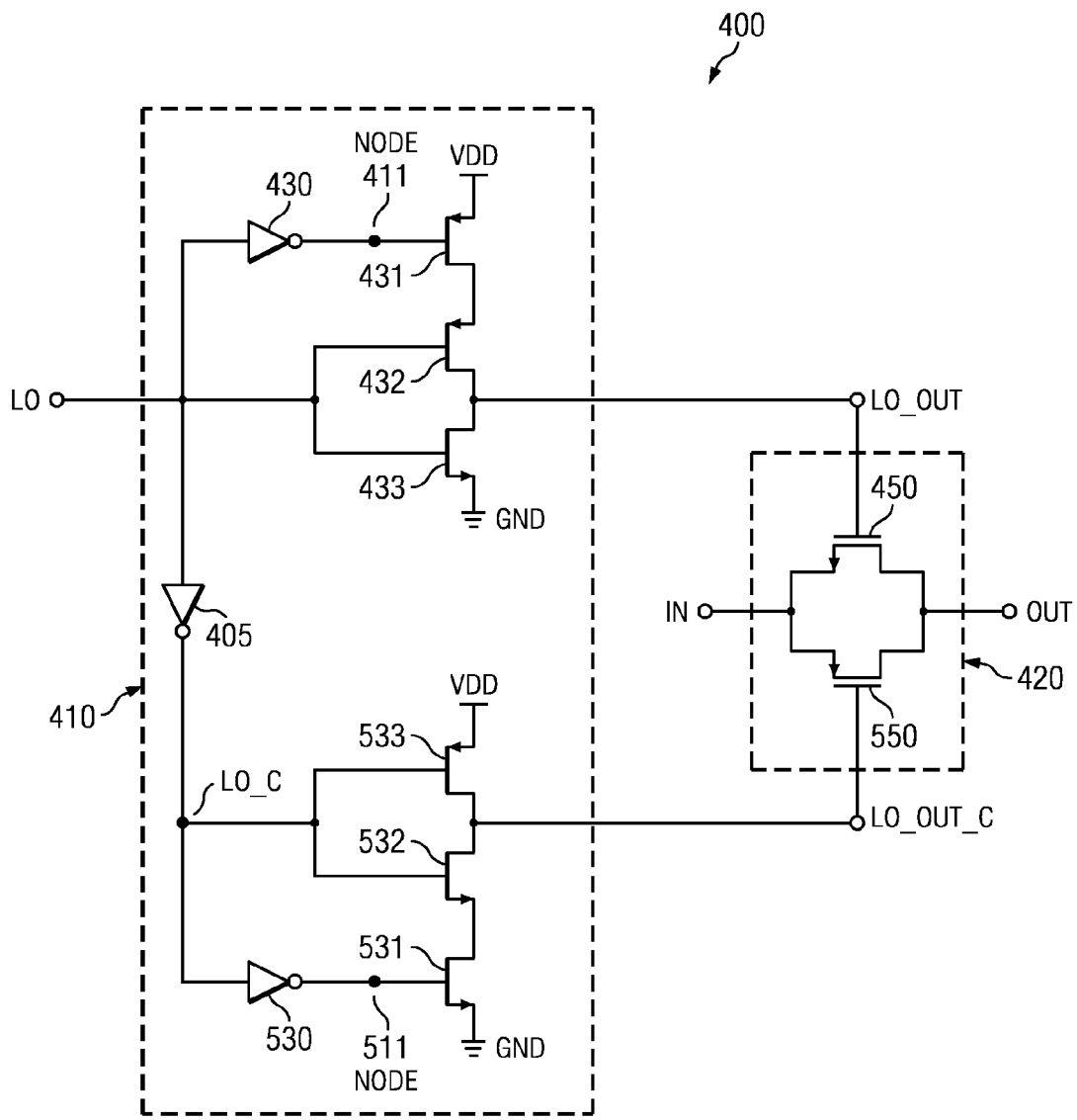
FIG. 4 illustrates a schematic diagram of an example converter, in accordance with certain embodiments of the present disclosure.

FIG. 4 illustrates a schematic diagram of an example converter 400, in accordance with certain embodiments of the present disclosure. As shown in FIG. 4, mixer 420 may have an N-type metal-oxide semiconductor field-effect transistor (NMOS) 450 and a P-type metal-oxide semiconductor field-effect transistor (PMOS) 550. The NMOS 450 and PMOS 550 may be parallel devices with their respective sources coupled together and their respective drains coupled together. The sources of NMOS 450 and PMOS 550 may be further coupled to the RF input of mixer 420, and the drains of NMOS 450 and PMOS 550 may be further coupled to the output of mixer 420. In some alternative embodiments, the mixer 420 may have NMOS 450 without the parallel PMOS 550. In some alternative embodiments, the mixer 420 may have PMOS 550 without the parallel NMOS 450.

In some embodiments, mixer driver 410 may be configured such that LO_OUT may drive an NMOS transistor in mixer 420. In some alternative embodiments, mixer driver may be configured such that LO_OUT may drive a PMOS transistor in mixer 420. As illustrated in FIG. 4, some embodiments of mixer 420 may have an NMOS 450 and a PMOS 550. To drive NMOS 450 and PMOS 550 in the same state at the same time, the mixer driver may be configured to drive a first output signal LO_OUT and a complimentary second output signal LO_OUT_C. In some embodiments, the first output signal LO_OUT may be coupled to the gate of NMOS 450, and the complimentary output signal LO_OUT_C may be coupled to the gate of PMOS 550.

Mixer driver 410 may be configured to receive an LO signal having two phases. For example, the LO signal may be at a high voltage (e.g., logic 1) during a first phase, and may be at a low voltage (e.g., logic 0) during a second phase. Mixer driver 410 may include devices configured to receive the LO signal and drive NMOS 450 in mixer 420. For example, mixer driver 410 may have an inverter 430, PMOS transistors 431 and 432, and an NMOS transistor 433. The local-oscillator signal may be received by the gates of NMOS 433 and PMOS 432, as well as the input of inverter 430, whose output is coupled to the gate of PMOS 431. PMOS 431 may have a source coupled to a high potential power supply VDD and a drain coupled to the source of PMOS 432. NMOS 433 may have a source coupled to a low potential power supply GND and a drain coupled to the drain of PMOS 432. The drains of NMOS 433 and PMOS 432 may be further coupled to the gate of NMOS 450 in mixer 420.

Inverter 430 may include any system, device or apparatus configured to invert a digital signal driven on its input. For example, if inverter 430 receives a low voltage (e.g., logic 0) driven on its input, it may drive a high voltage (e.g., logic 1) on its output. Alternatively, if inverter 430 receives a high voltage (e.g., logic 1) driven on its input, it may drive a low voltage (e.g., logic 0) on its output. Inverter 430 may be implemented as a PMOS inverter, NMOS inverter, static CMOS inverter, saturated-load digital inverter, or any other suitable implementation. Inverter 430 may include one or more internal stages comprising one or more logic gates such as an inverter, a NAND gate with its inputs coupled together, a NOR gate with its inputs coupled together, or any other suitable logic gate or combination of logic gates. Inverter 430 may have a propagation delay, i.e., a period of time for which the output of the inverter takes to respond to a change at the input of the inverter.

Figure 5:
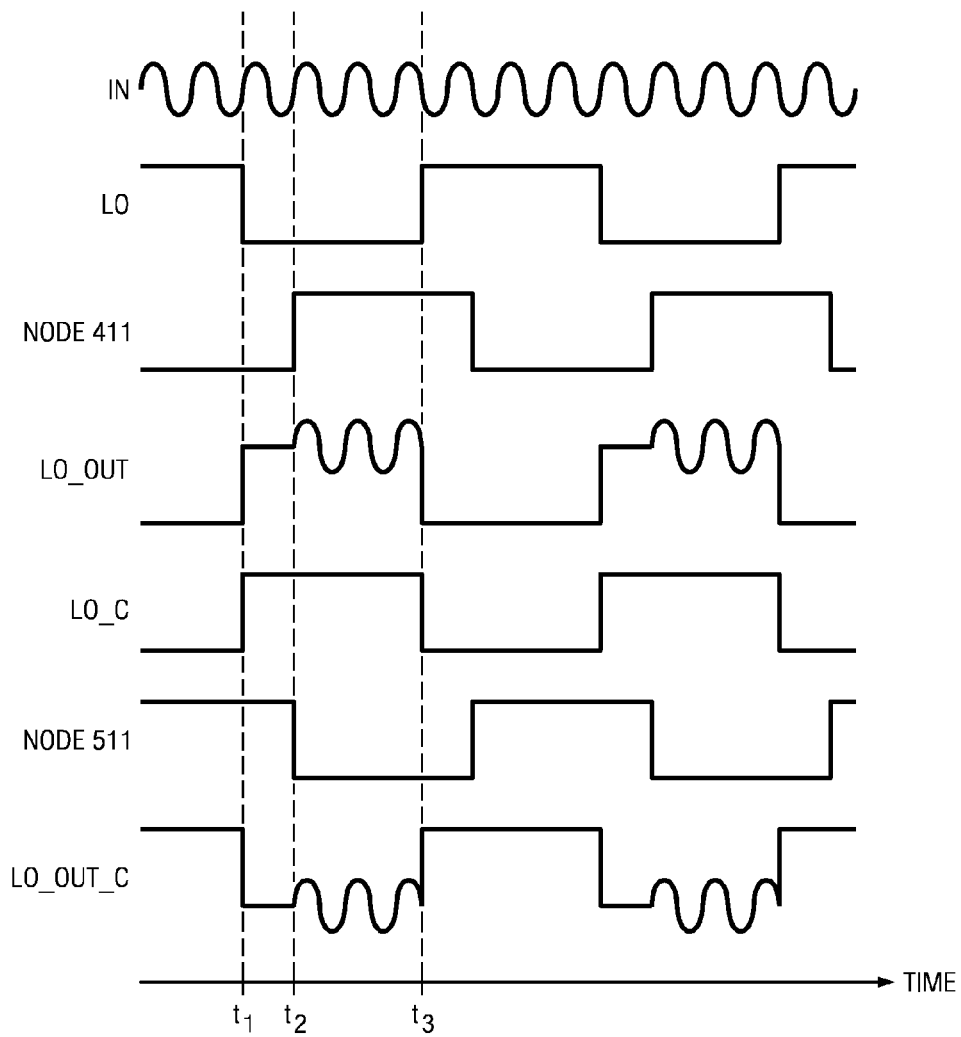
FIG. 5 illustrates a graph of example waveforms over time for selected signals at nodes of the converter depicted in FIG. 4, in accordance with certain embodiments of the present disclosure.
Figure 6:
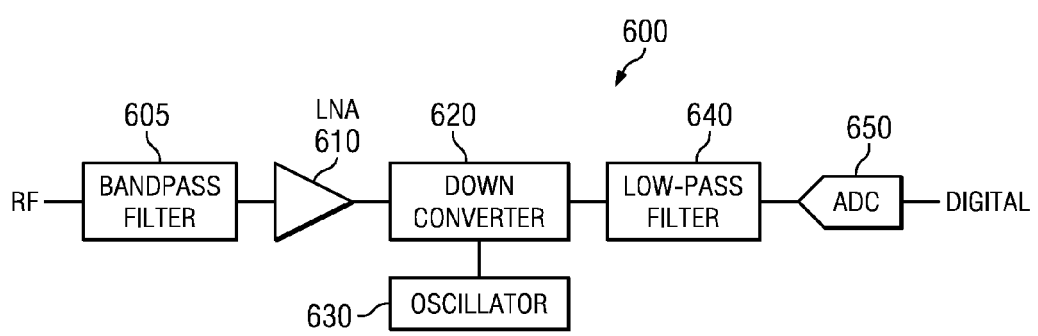
FIG. 6 illustrates selected components of a traditional receiver, as is known in the art.

When the local-oscillator signal (LO) transitions from high to low (e.g., logic 1 to logic 0) or from low to high (e.g., logic 0 to logic 1), there may be a propagation delay through the inverter 430. As illustrated in FIG. 5, the propagation delay of inverter 430 may result in an LO_OUT signal at an output of the mixer driver 410 having three states over time in response to the two phases of the LO signal at the input of mixer driver 410. The three states of the LO_OUT signal may be used to drive NMOS 450 in a manner that improves the linearity of the mixer 420.

For example, when the LO signal is high (e.g., logic 1) during a first phase, NMOS 433 may be on and PMOS 432 may be off, thus driving LO_OUT low and driving NMOS 450 off during the first phase. At this time, node 411 may be driven low (e.g., logic 0) by the inverter 430 and PMOS 431 may be on. When the LO signal transitions from high during the first phase to low during the second phase, NMOS 433 may transition from on to off, and the PMOS 432 may transition from off to on. As illustrated on FIG. 5, node 411 may remain low during the propagation delay of inverter 430 from time $t_1$ to time $t_2$, and PMOS 431 may remain on. Thus LO_OUT may be driven high and NMOS 450 may be driven on for a first period of time dependent at least on the propagation delay of inverter 430. After the propagation delay of inverter 430, node 411 may transition from low to high at time $t_2$, and PMOS 431 may transition from on to off. At this time, PMOS 431 and NMOS 433 may both be off. With no conducting path between the high potential power supply VDD and LO_OUT, and no conducting path between LO_OUT and the low potential power supply GND, LO_OUT may be forced into a high impedance state, and the gate of NMOS 450 may be floating for a second period of time from time $t_2$ to time $t_3$, i.e., the remainder of the second phase. FIG. 5 is illustrative but is not intended to be to scale. In some embodiments, the period of time between $t_1$ and $t_2$ may consume a substantially smaller portion of the total time between $t_1$ and $t_3$, and the second period of time between $t_2$ and $t_3$ may consume a greater portion of the total time between $t_1$ and $t_3$.

Forcing the gate of NMOS 450 into a high impedance state after driving NMOS 450 in an on state may improve the linearity of mixer 420. NMOS 450 may have a parasitic gate-to-source capacitance ($C_{gs}$), causing the gate of NMOS 450 to be capacitively coupled to the source of NMOS 450. Capacitance may be equivalent to an open circuit for the DC component of a signal, and may be equivalent to a short circuit for the AC component of a signal. When the gate of NMOS 450 is driven in a high impedance state, LO_OUT at the gate of NMOS 450 may track the AC component of the input signal at the source of NMOS 450 because of the capacitive coupling between the gate of NMOS 450 and the source of NMOS 450. Thus, during the high impedance state, the gate-to-source voltage ($V_{gs}$) of NMOS 450 will remain roughly equal to the $V_{gs}$ level established when LO_OUT transitioned from a being driven in a high state to being forced into a high impedance state. With a substantially constant $V_{gs}$ during the high impedance state, the $R_{on}$ of NMOS 450 may remain constant as the input signal passes through NMOS 450. The constant $R_{on}$ of NMOS 450 may improve the linearity of mixer 420 as compared to a mixer where the $R_{on}$ of a MOSFET is dependent upon the signal being passed.

Mixer driver 410 may be configured to receive an LO signal having two phases and convert the LO signal to a complimentary local-oscillator signal LO_C. As illustrated in FIG. 4, mixer driver 410 may include an inverter 405 to convert an LO signal into an LO_C signal. Inverter 405 may include any system, device or apparatus configured to invert a signal driven on its input. Accordingly, the LO_C signal may be at a low voltage (e.g., logic 0) when the LO signal is at a high voltage (e.g., logic 1) during a first phase, and the LO_C signal may be at a high voltage (e.g., logic 1) when the LO signal is at a low voltage (e.g., logic 0) during a second phase. In some alternative embodiments, the complimentary local-oscillator signal LO_C may be generated by the oscillator 210 or at another location outside of the mixer driver. Mixer driver 410 may include devices configured to receive the LO_C signal and drive PMOS 550 in mixer 420. For example, mixer driver 410 may have an inverter 405, an inverter 530, NMOS transistors 531 and 532, and a PMOS transistor 533. The local-oscillator signal LO may be received by the input of inverter 405 which drives the complimentary local-oscillator signal LO_C at its output. The complimentary local-oscillator signal LO_C may be received by the gates of PMOS 533 and NMOS 532, as well as the input of inverter 530, whose output is coupled to the gate of NMOS 531. NMOS 431 may have a source coupled to a low potential power supply GND and a drain coupled to the source of NMOS 532. PMOS 533 may have a source coupled to a high potential power supply VDD and a drain coupled to the drain of NMOS 532. The drains of PMOS 533 and NMOS 532 may be further coupled to the gate of NMOS 450 in mixer 420.

Inverter 530 may include any system, device or apparatus configured to invert a digital signal driven on its input. For example, if inverter 530 receives a low voltage (e.g., logic 0) driven on its input, it may drive a high voltage (e.g., logic 1) on its output. Alternatively, if inverter 530 receives a high voltage (e.g., logic 1) driven on its input, it may drive a low voltage (e.g., logic 0) on its output. Inverter 530 may be implemented as a PMOS inverter, NMOS inverter, static CMOS inverter, saturated-load digital inverter, or any other suitable implementation. Inverter 530 may include one or more internal stages comprising one or more logic gates such as an inverter, a NAND gate with its inputs coupled together, a NOR gate with its inputs coupled together, or any other suitable logic gate or combination of logic gates. Inverter 530 may have a propagation delay, i.e., a period of time for which the output of the inverter takes to respond to a change at the input of the inverter.

When the complimentary local-oscillator signal LO_C transitions from low to high (e.g., logic 0 to logic 1) or from high to low (e.g., logic 1 to logic 0), there may be a propagation delay through the inverter 530. As illustrated in FIG. 5, the propagation delay of inverter 530 may result in an LO_OUT_C signal at an output of the mixer driver 410 having three distinct states over time in response to the two phases of the LO_C signal in the mixer driver 410. The three states of the LO_OUT_C signal may be used to drive PMOS 550 in a manner that improves the linearity of the mixer 420.

For example, when the LO_C signal is low (e.g., logic 0) during a first phase, PMOS 533 may be on and NMOS 532 may be off, thus driving LO_OUT_C high and driving PMOS 550 off during the first phase. At this time, node 511 may be driven high (e.g., logic 1) by the inverter 530 and NMOS 531 may be on. When the LO_C signal transitions from low during the first phase to high during the second phase, PMOS 533 may transition from on to off, and the NMOS 532 may transition from off to on. As illustrated in FIG. 5, node 511 may remain high during the propagation delay of inverter 530 from time $t_1$ to time $t_2$, and NMOS 531 may remain on. Thus LO_OUT_C may be driven low and PMOS 550 may be driven on for a period of time dependent at least on the propagation delay of inverter 530. Though the propagation delay of inverter 530 may be generated independently from the propogation delay of inverter 430, mixer driver 410 may be designed such that the two propogation delays substantially coincide, and thus the period of time during which PMOS 550 is driven on may substantially coincide with the period of time during which NMOS 450 is driven on. After the propagation delay of inverter 530, node 511 may transition from high to low at time $t_2$, and NMOS 531 may transition from on to off. At this time, NMOS 531 and PMOS 533 may both be off. With no conducting path between the high potential power supply VDD and LO_OUT_C, and no conducting path between LO_OUT_C and the low potential power supply GND, LO_OUT_C may be forced into a high impedance state, and the gate of PMOS 550 may be floating for a period of time from time $t_2$ to time $t_3$, i.e., the remainder of the second phase. Though the period of time during which PMOS 550 is forced into a high impedance state may be generated independently from the period of time during which NMOS 450 is forced into a high impedance state, these mixer driver 410 may be designed such that the period of time during which PMOS 550 is forced into a high impedance state may substantially coincide with the period of time during which NMOS 450 is forced into a high impedance state.

Forcing the gate of PMOS 550 into a high impedance state after driving PMOS 550 in an on state may improve the linearity of mixer 420. PMOS 550 may have a parasitic gate-to-source capacitance ($C_{gs}$), causing the gate of PMOS 550 to be capacitively coupled to the source of PMOS 550. Capacitance may be equivalent to an open circuit for the DC component of a signal, and may be equivalent to a short circuit for the AC component of a signal. When the gate of PMOS 550 is driven in a high impedance state, LO_OUT_C at the gate of PMOS 550 may track the AC component of the input signal at the source of PMOS 550 because of the capacitive coupling between gate and source of PMOS 550. Thus, during the high impedance state, the gate-to-source voltage ($V_{gs}$) of PMOS 550 will remain roughly equal to the $V_{gs}$ level established when LO_OUT_C transitioned from a being driven in a low state to being forced into a high impedance state. With a substantially constant $V_{gs}$ during the high impedance state, the $R_{on}$ of PMOS 550 may remain constant as the RF signal passes through PMOS 550. The constant $R_{on}$ of PMOS 550 may improve the linearity of mixer 420 as compared to a mixer where the $R_{on}$ of a MOSFET is dependent upon the signal being passed.

Alternative embodiments of mixer driver 410 may include any system, device, or apparatus configured to, in response to a local oscillator signal or a complimentary local oscillator signal, drive the gate of a transistor in mixer 420 in a high impedance state for a second period of time after driving that gate in a state which turns the transistor on for a first period of time.

What is claimed is:

1. A converter, comprising:
   a mixer comprising a first metal-oxide semiconductor field-effect transistor (MOSFET) having a gate, a first conducting terminal coupled to an input of the converter, and a second conducting terminal coupled to an output of the converter; and
   a mixer driver having a first output coupled to the gate of the first MOSFET, the mixer driver configured to:
      receive a local-oscillator signal having a first phase and a second phase;
      drive the first MOSFET off during the first phase of the local-oscillator signal;
      drive the first MOSFET on for a first period of time in response to a transition from the first phase of the local-oscillator signal to the second phase of the local-oscillator signal; and
      force the gate of the first MOSFET into a high impedance state for a second period of time during the second phase of the local-oscillator signal and after the expiration of the first period of time.

2. The converter of claim 1, wherein the first MOSFET is an N-type metal-oxide semiconductor transistor.

3. The converter of claim 1, wherein the first MOSFET is a P-type metal-oxide semiconductor transistor.

4. The converter of claim 1, wherein the duration of the first period of time is dependent on a propagation delay of at least a first logic gate in the mixer driver.

5. The converter of claim 1, wherein:
the mixer further comprises a second MOSFET having a gate, a first conducting terminal coupled to the input of the converter, and a second conducting terminal coupled to the output of the converter; and
the mixer driver further comprises a second output coupled to the gate of the second MOSFET, the logic circuit further configured to:
drive the second MOSFET off during the first phase of the local-oscillator signal;
drive the second MOSFET on for a third period of time in response to the transition from the first phase of the local-oscillator signal to the second phase of the local-oscillator signal; and
force the gate of the second MOSFET into a high impedance state for a fourth period of time during the second phase of the local-oscillator signal and after the expiration of the second period of time.

6. The converter of claim 5, wherein the first MOSFET is an N-type metal-oxide semiconductor transistor and the second MOSFET is a P-type metal-oxide semiconductor transistor.

7. The converter of claim 5, wherein the duration of the second period of time is dependent on a propagation delay of at least a second logic gate in the mixer driver.

8. A receiver, comprising:
a local oscillator configured to provide a local-oscillator signal having a first phase and a second phase; and
a converter configured to downconvert a radio-frequency (RF) signal, the converter comprising:
a mixer comprising a first metal-oxide semiconductor field-effect transistor (MOSFET) having a gate, a first conducting terminal coupled to an RF input of the converter, and a second conducting terminal coupled to an intermediate-frequency (IF) output of the converter; and
a mixer driver having a first output coupled to the gate of the first MOSFET, the mixer driver configured to:
receive the local-oscillator signal;
drive the first MOSFET off during the first phase of the local-oscillator signal;
drive the first MOSFET on for a first period of time in response to a transition from the first phase of the local-oscillator signal to the second phase of the local-oscillator signal; and
force the gate of the first MOSFET into a high impedance state for a second period of time during the second phase of the local-oscillator signal and after the expiration of the first period of time.

9. The receiver of claim 8, wherein the first MOSFET is an N-type metal-oxide semiconductor transistor.

10. The receiver of claim 8, wherein the first MOSFET is a P-type metal-oxide semiconductor transistor.

11. The receiver of claim 8, wherein the duration of the first period of time is dependent on a propagation delay of at least a first logic gate in the mixer driver.

12. The receiver of claim 8, further comprising a low-pass filter coupled to the IF output of the converter, the low-pass filter configured to convert an IF signal to a baseband signal.

13. The receiver of claim 12, further comprising an analog-to-digital converter (ADC) coupled to an output of the low-pass filter, the ADC configured to convert the baseband signal into a digital output signal.

14. A method for reducing non-linear effects in an electronic circuit including a converter, comprising:
receiving an input signal at a first conducting terminal of a first metal-oxide semiconductor field-effect transistor (MOSFET);
receiving a local-oscillator signal having a first phase and a second phase;
driving the first MOSFET off during the first phase of the local-oscillator signal;
driving the first MOSFET on for a first period of time in response to a transition from the first phase of the local-oscillator signal to the second phase of the local-oscillator signal; and
forcing the gate of the first MOSFET into a high-impedance state for a second period of time during the second phase of the local-oscillator signal and after the expiration of the first period of time.

15. The method of claim 14, wherein the first MOSFET is an N-type metal-oxide semiconductor transistor.

16. The method of claim 14, wherein the first MOSFET is a P-type metal-oxide semiconductor transistor.

17. The method of claim 14, wherein the duration of the first period of time is dependent on a propagation delay of at least a first logic gate in the mixer driver.

18. The method of claim 14, further comprising:
wherein a first conducting terminal of a second MOSFET is coupled to the first conducting terminal of the first MOSFET, and a second conducting terminal of the second MOSFET is coupled to the second conducting terminal of the first MOSFET;
driving the second MOSFET off during the first phase of the local-oscillator signal;
driving the second MOSFET on for a third period of time in response to the transition from the first phase of the local-oscillator signal to the second phase of the local-oscillator signal;
forcing the gate of the second MOSFET into a high-impedance state during a fourth period of time during the second phase of the local-oscillator signal and after the expiration of the third period of time.

19. The method of claim 18, wherein the first MOSFET is an N-type metal-oxide semiconductor transistor and the second MOSFET is a P-type metal-oxide semiconductor transistor.

20. The method of claim 18, wherein the duration of the third period of time is dependent on a propagation delay of at least a second logic gate in the mixer driver.

* * * * *